United States Patent
Yanagisawa et al.

(10) Patent No.: US 6,885,042 B2
(45) Date of Patent: Apr. 26, 2005

(54) HETERO-JUNCTION BIPOLAR TRANSISTOR AND A MANUFACTURING METHOD OF THE SAME

(75) Inventors: Masaki Yanagisawa, Yokohama (JP); Hiroshi Yano, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/436,442

(22) Filed: May 13, 2003

(65) Prior Publication Data

US 2004/0016941 A1 Jan. 29, 2004

(30) Foreign Application Priority Data

May 13, 2002 (JP) ........................................ 2002-137532

(51) Int. Cl.[7] ........................ H01L 29/737; H01L 23/58
(52) U.S. Cl. .................................... 257/197; 257/646
(58) Field of Search ................................ 257/197, 646

(56) References Cited

U.S. PATENT DOCUMENTS

| | | |
|---|---|---|
| 5,001,534 A | 3/1991 | Lunardi et al. |
| 5,712,504 A | 1/1998 | Yano et al. |
| 6,031,255 A * | 2/2000 | Delage et al. ............... 257/198 |
| 6,593,635 B2 * | 7/2003 | Yanagisawa et al. ........ 257/458 |

OTHER PUBLICATIONS

Tokumitsu et al, "Reduction of the Surface . . . Passivation Layer", Dec. 1989, vol. 10, No. 12, IEEE Elecron Device Letters pp. 585–587.*
Copending U.S. Appl. No. 10/370,604, filed Feb. 24, 2003.
Won–Seong Lee, et al., Effect of Emitter–Base Spacing on the Current Gain of AlGaAs/GaAs Heterojunction Bipolar Transistors, IEEE Electron Device Letters, vol. 10, No. 5, May 1989, pp. 200–202.

* cited by examiner

Primary Examiner—Jerome Jackson
(74) Attorney, Agent, or Firm—Smith, Gambrell & Russell, LLP

(57) ABSTRACT

This invention provides a hetero-junction bipolar transistor (HBT) having a large base-collector breakdown voltage. The HBT has a collector, a base and an emitter. The emitter is made of a semiconductor material whose band gap energy is greater than that of the base. An passivation layer made of a semiconductor material cover the collector, the base and the emitter and the band gap energy of the passivation layer is greater than that of the collector and the base.

15 Claims, 15 Drawing Sheets

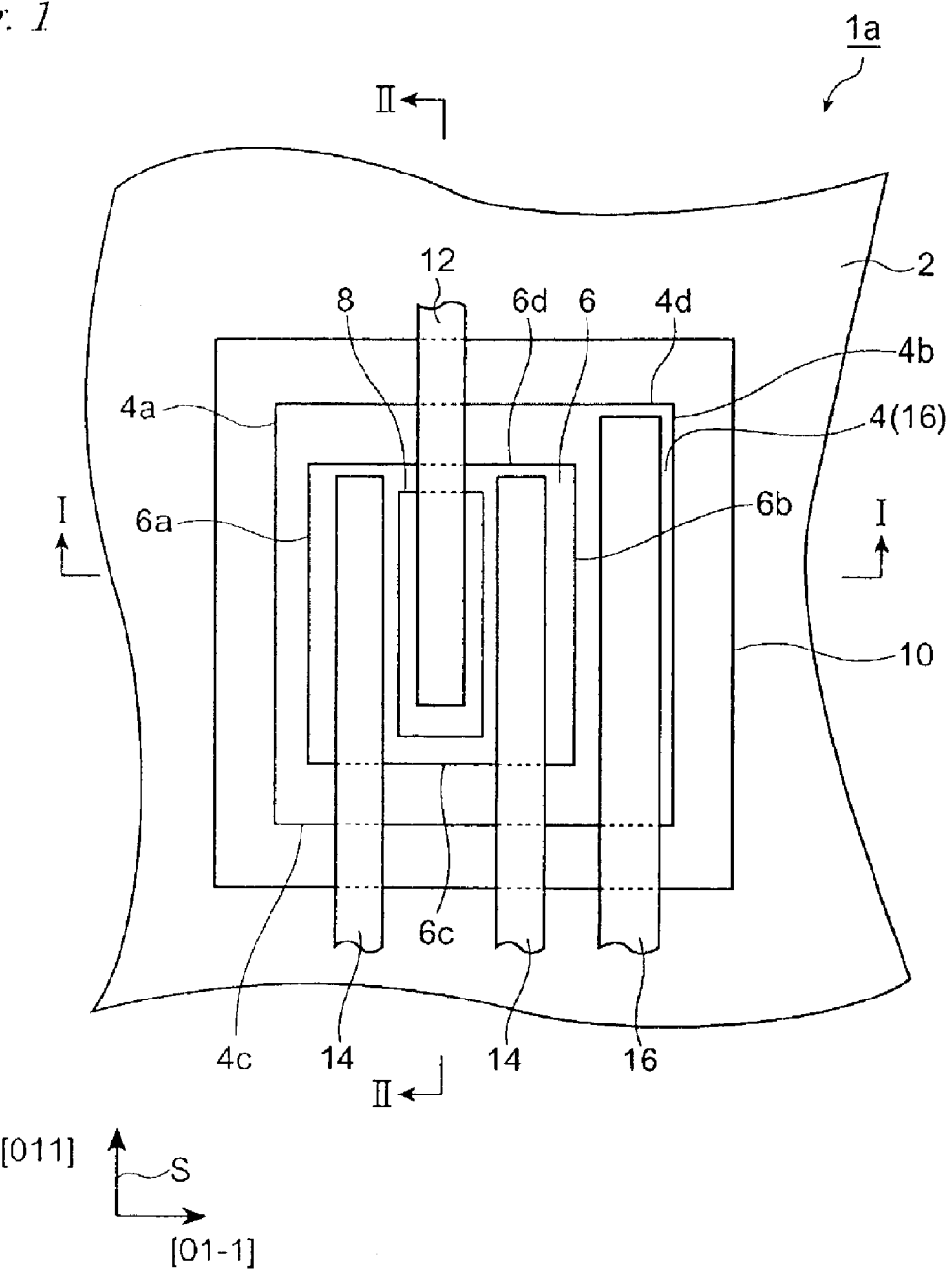

Fig. 6
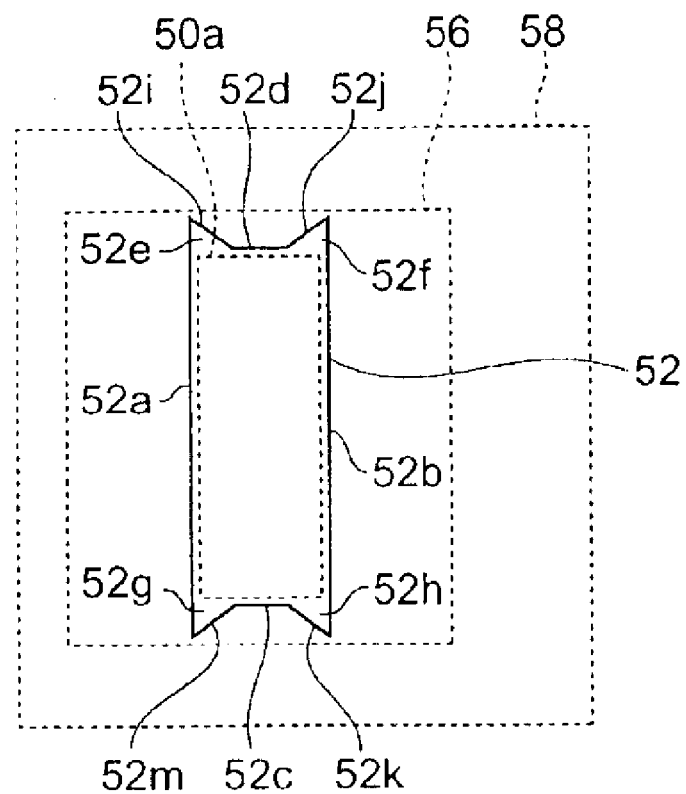
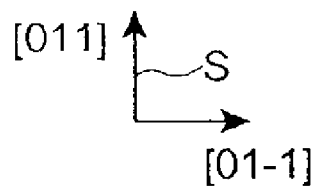

Fig. 7
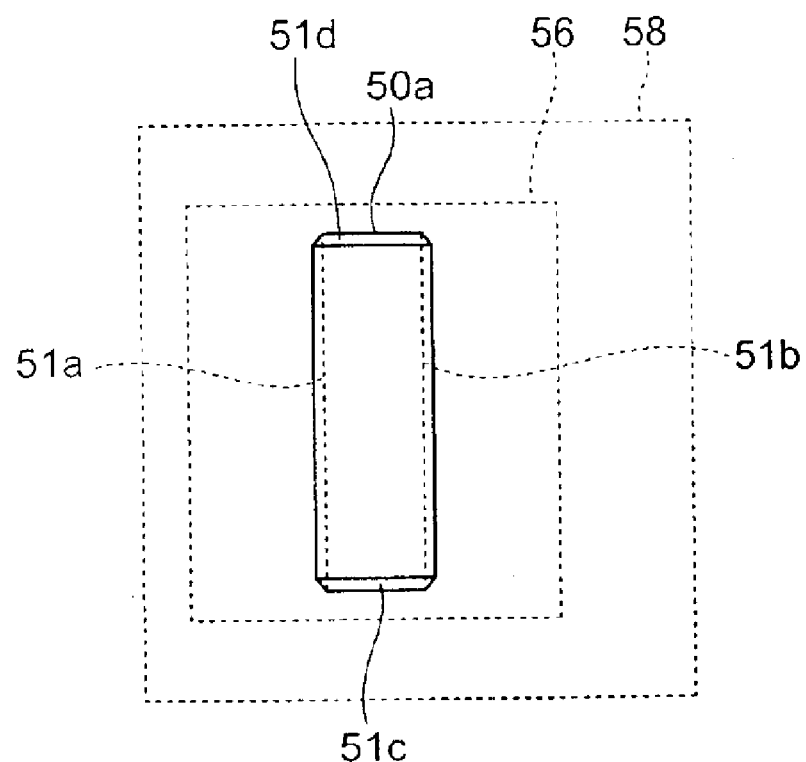
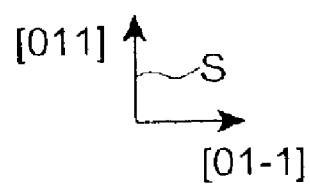

HETERO-JUNCTION BIPOLAR TRANSISTOR AND A MANUFACTURING METHOD OF THE SAME

BACKGROUND OF THE INVENTION

1. Field of the Invention

This invention relates to an hetero-junction bipolar transistor and a manufacturing method of the transistor.

2. Related Prior Art

In a process for manufacturing a semiconductor device, in which silicon (Si) is a primary material, a passivation film made of inorganic material such as a silicon dioxide ($SiO_2$) may be applied for protecting and covering the device from an ambience. The $SiO_2$ with excellent quality can be easily obtained by oxidization of silicon itself. In the case of a hetero-junction bipolar transistor (hereinafter denoted as HBT) primarily made of compound semiconductor materials, an oxide material with a good quality as compared with the thermally oxidized silicon film has not been realized yet.

The HBT made of compound semiconductor material generally has a base-collector junction, an edge of which is exposed to the ambience. When an inorganic material, such as $SiO_2$ or a silicon nitride (SiN) covers the edge of the junction, a current leaking from the collector to the base may increase because a crystal quality is deteriorated by the existence of the inorganic film at the edge of the junction. When the semiconductor surface is exposed to the plasma to form the inorganic film thereon, plasma damages will be introduced. Moreover, when the inorganic film covers the semiconductor surface, surface states due to dangling bonds of the semiconductor will increase. These damages and surface states may provide a current leaking pass.

Under a normal operating conditions of the HBT, large reverse bias is applied between the base and the collector. Therefore, to decrease the leak current between the base and the collector is most effective to enhance the breakdown voltage. In the HBT, in which the inorganic film covers the surface thereof, it has been difficult to decrease the leak current between the base and the collector, and to enhance the breakdown voltage.

SUMMARY OF THE INVENTION

One aspect of the present invention relates to a hetero-junction bipolar transistor.

The hetero-junction bipolar transistor of the present invention has a collector layer, a base layer, an emitter layer and a passivation layer. Band gap energy of the passivation layer is greater than that of the base layer and also that of the collector layer. The passivation layer is made of a semiconductor material and covers both the base layer and the collector layer.

Since the passivation layer is made of un-doped semiconductor material and has the band gap energy greater than that of the base layer and the collector layer, un-desired current passes are not generated in both the passivation layer and the surface of the base layer and that of the collector layer. Therefore, the break down voltage of the HBT can be increased.

The HBT of the present invention preferably further comprises an emitter contact layer. The emitter contact layer has a band gap energy smaller than that of the emitter layer. The emitter layer is sandwiched by the emitter contact layer and the base layer therebetween. The passivation layer covers the emitter contact layer, the emitter layer, the base layer and the collector layer.

Since the passivation layer covers the emitter contact layer, the current leaking pass on the surface of the emitter contact layer can be eliminated. Moreover, the emitter contact layer is highly doped and the emitter electrode is formed on the emitter contact layer, the emitter contact resistance can be decreased, thereby enhancing the performance of the HBT.

The HBT of the present invention preferably has a sub-collector layer. The collector layer is sandwiched by the sub-collector layer and the base layer therebetween. The passivation layer covers at least a surface of the sub-collector layer.

Since the passivation layer covers the surface of the collector layer, the current leaking between the base and the sub-collector through the surface of the collector layer can be decreased.

The HBT of the present invention preferably includes InGaAs for the collector layer, the base layer and the emitter contact layer. The emitter layer is preferably made of InP and the passivation layer is preferably made of un-doped InP. The InGaAs of the collector layer, the base layer and the emitter layer are lattice-matched to InP.

Another aspect of the present invention relates to the HBT comprising a collector layer, a base layer and a passivation layer. The passivation layer covers the collector layer and the base layer, and made of un-doped semiconductor material, whose band gap energy is greater than that of the base layer and also the collector layer. The passivation serves a function as an emitter layer.

Since the band gap energy of the passivation layer is greater than that of the collector layer and the base layer in addition that the passivation layer covers both layers, undesired current passes are not generated in both the passivation layer and the surface of the base layer and that of the collector layer. Therefore, the break down voltage of the HBT can be increased.

The HBT according to the present aspect of the invention preferably further comprises an emitter contact layer. The emitter contact layer has a band gap energy smaller than that of the emitter layer. The passivation layer is sandwiched by the emitter contact layer and the base layer therebetween.

Since the emitter contact layer is highly doped and the emitter electrode is formed on the emitter contact layer, the contact resistance can be decreased, thereby enhancing the performance of the HBT.

The HBT of the present aspect of the invention preferably further comprises a sub-collector layer. The collector layer is sandwiched by the sub-collector layer and the base layer therebetween. The passivation layer covers at least a surface of the sub-collector layer.

Since the passivation layer covers the surface of the collector layer, the current leaking between the base and the collector through the surface of the collector layer can be decreased.

The HBT of the present aspect preferably includes InGaAs for the collector layer, the base layer and the emitter contact layer. The passivation layer is preferably made of un-doped InP. The InGaAs of the collector layer, the base layer and the emitter layer are lattice-matched to InP.

Third aspect of the present invention relates to a method for manufacturing the HBT. The method comprises steps of; (a) growing a collector layer, a base layer and an emitter layer on a semiconductor substrate; (b) forming a second mesa containing the collector layer, the base layer and the emitter layer; and (c) glowing a passivation layer made of a semiconductor material. Band gap energy of the emitter layer is greater than that of the base layer. Band gap energy of the passivation layer is greater than that of the collector layer and also the base layer. The passivation layer covers the collector layer, the base layer and the emitter layer.

The method of the third aspect of the invention preferably further comprises the step of sowing an emitter contact layer subsequently to the growth of the emitter layer and forming an emitter contact mesa preceding of forming the second mesa. The emitter contact layer has a band gap energy smaller than that of the emitter layer. The passivation layer covers the emitter contact layer.

The method of the third aspect of the invention preferably further comprises a step of growing a sub-collector layer preceding the growth of the collector layer. The process may comprise of forming a second mesa containing the sub-collector layer preceding or subsequently to the growth of the passivation layer.

Forth aspect of the present invention relates to a method for manufacturing the HBT. The method comprises steps of: (a) sequentially growing the collector layer and the base layer; (b) forming a second mesa containing the collector layer and the base layer; and (c) growing a passivation layer so as to cover the collector layer and the base layer. The passivation layer is made of un-doped semiconductor material, whose band gap energy is greater than that of the base and the collector layer. The passivation layer serves a function of an emitter layer.

The method of the fourth aspect of the invention preferably further (comprises the step of growing an emitter contact layer after the growth of the passivation layer. The emitter contact layer has a band gap energy smaller than that of the passivation layer.

The method of the fourth aspect of the invention preferably further comprises the steps of growing a sub-collector layer preceding the growth of the collector layer. The collector layer is sandwiched by the sub-collector layer and the base layer therebetween. The method further comprises the step of forming a first mesa preceding or subsequently to the growth of the passivation layer.

BRIEF DESCRIPTION OF DRAWINGS

FIG. 1 is a plan view showing a hetero-junction bipolar transistor according to the first embodiment of the invention;

FIG. 4A is a sectional view taken along the line III—III, while

FIG. 6 shows a plan view of the etching mask for the formation of the emitter contact mesa;

FIG. 7 is a plan view showing the emitter contact mesa;

DETAILED DESCRIPTION OF THE INVENTION

Figure 2A:
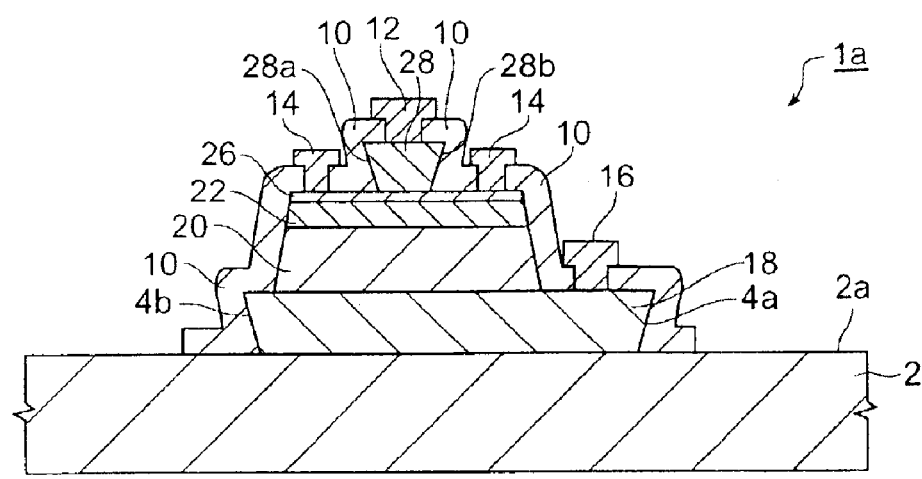
FIG. 2A is a sectional view taken along the line I—I.

The preferred embodiments of the present invention will be described. In the drawings, elements identical to each other will be referred to with numerals identical to each other without overlapping explanations.

(First Embodiment)

Figure 2B:
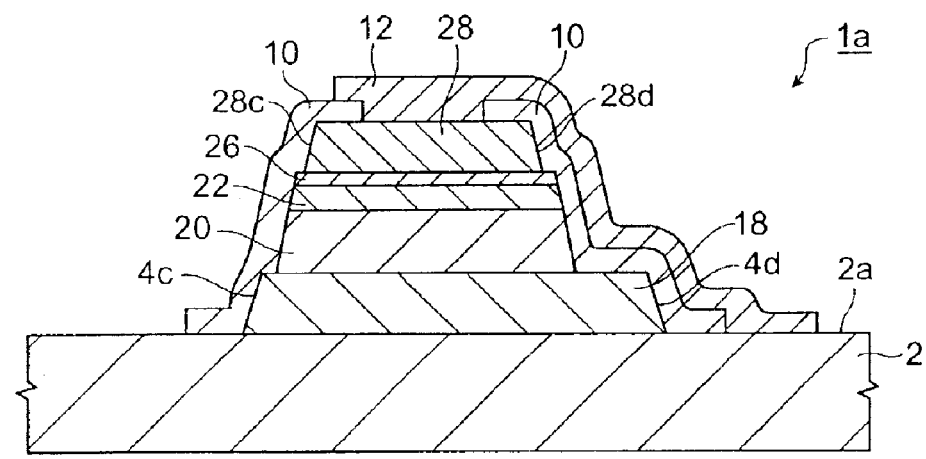
FIG. 2B is a sectional view along the line II—II in FIG. 1.

FIG. 1 is a plan view of the HBT according to the first embodiment. FIG. 2A is a sectional view taken along the line I—I in FIG. 1, and FIG. 2B is a sectional view taken along the lint II—II in FIG. 1. The HBT 1 of the present embodiment is an npn-transistor made of group III–V compound semiconductor materials with an energy band gap of the emitter is greater than that of the base.

As shown in FIG. 1, the HBT 1a comprises a substrate 2, a first mesa 4, a second mesa 6, an emitter contact mesa 8, a passivation layer 10, and electrodes 12, 14 and 16 the emitter, the base and the collector, respectively. The substrate 2 is a semi-insulating InP with a primary surface of the (100) crystal surface.

The configuration of the HBT 1a will be explained as referring to FIG. 1, FIG. 2A and FIG. 2B. The first mesa 4 is disposed on the primary surface of the substrate 2 and contains a sub-collector layer 18. The first mesa 4 has a pair of side surfaces 4a, 4b extending along the [011] crystal orientation and another pair of side surface 4c, 4d extending along the [01–1] orientation. The first mesa 4 has two regions, the first region of which is surrounded by the second region thereof. The collector electrode 16 is provided on the second region and extending along the [011] orientation as traversing the side surface 4c. The first mesa 4 electrically isolates the HBT 1a from the other devices formed on the substrate 2.

The second mesa 6 is disposed on the first mesa 4 and contains the collector layer 20 and the base layer 22. The second mesa has a pair of side surfaces 6a, 6b extending along the [011] orientation and the other pair of side surfaces 6c, 6d extending along the [01–1] orientation. The second mesa has two regions, the first region of which is surrounded by the second region thereof. The base electrode 14 is provided on the second region and extending along the [011] orientation as traversing the side surface 6c of the second mesa 6 and the side surface 4c of the first mesa 4. The collector layer 20 is disposed on the sub-collector layer 18 and the base layer 22 is disposed on the collector layer 20. The second mesa may contain the emitter layer 26 on the base layer 22. However, the emitter layer 26 may be formed independently on the second mesa 6.

The emitter contact mesa 8 is disposed on the second mesa 6 and contains the emitter contact layer 28. The emitter contact mesa 28 has a pair of side surfaces 28a, 28b extending along the [011] orientation and the other pair of side surfaces 28c, 28d extending along the [01–1] orientation. The side surfaces 28a, 28b have a reverse trapezoidal shape while the surfaces 28c, 28d have a normal trapezoidal shape. The emitter electrode 12 is provided on the emitter contact layer 28 and extending along the [011] orientation as traversing the side surface 28d with the normal trapezoidal shape and the side surfaces 6d, 4d of the second mesa and the first mesa 4, respectively.

The passivation layer 10 covers the collector layer 20, the base layer 22 and the emitter layer 26. In the present embodiment shown in FIG. 1, although the passivation layer 10 is disposed only in a rectangle area where the collector layer 20, the base layer 22 and the emitter layer 26 are formed, it preferably covers the entire surface of the substrate 2 to passivate and protect the surface of the semiconductor material.

Since the passivation layer is made of a semiconductor material, whose band gap energy is greater than that of the collector layer 20, a possibility for generating a current leaking pass between respective electrodes can be reduced, whereby the passivation layer 10 enhances the breakdown voltage of the HBT 1a.

Further, since the passivation layer 10 of the present HBT 1a is made of a semiconductor material instead of a inorganic material containing Si atoms, the same manufacturing process as that for other semiconductor layers is applicable. This means that the surface of the semiconductor layer does not expose to the plasma ions, thereby preventing the generation of the surface state and the surface damage due to the plasma ions.

A depletion region can be formed entirely in the passivation layer 10 when an impurity density is small enough. A condition that the entire depletion region is formed in the passivation layer is that a thickness thereof is below 400 nm and a carrier concentration is below $1.0 \times 10^{15}$ cm$^{-3}$. The depletion region prevents the leak current flowing through the passivation layer 10. The passivation layer 10 is preferably un-doped layer to form reliably the depletion region. Since the carrier concentration of the fully depleted passivation layer 10 is quite low, the parasitic capacitance due to the carriers can be reduced, thereby enhancing the high frequency performance of the HBT 1a.

Further, since a large voltage is applied to the junction between the base and the collector under the normal operating condition of the transistor, a hot electron accelerated by this large applied voltage may be generated at the junction. On the other hand, the edge of the junction is exposed on the side surface of the first mesa 4. When the inorganic layer containing Si atoms cover the side surface thereof and the interface states or the surface states are caused by a plasma damage, such interface state or the surface state captures the hot electrons. This mechanism increases the leak current flowing close to the surface. In the present configuration, since the passivation layer made of the semiconductor material covers the exposed junction edge, the capture of the hot electrons can be restrained.

Moreover, since the semiconductor passivation layer 10 covers the emitter contact layer 28, the leak current that flow the surface thereof can be also reduced. When the passivation layer 10 covers the first mesa 4, the leak current that; flows between devices formed on the substrate 2 can be restricted, too.

The following table specifies the structure of the HBT 1a of the present embodiment:

TABLE

The configuration of the HBT of the first embodiment

| | Material | Dopant | Carrier Concentration (cm$^{-3}$) | Thickness (nm) |
|---|---|---|---|---|
| Substrate 2 | InP | — | Semi-Insulating | |
| Sub-Collector 18 | InGaAs | Si | $(1.0~2.0) \times 10^{19}$ | 200~500 |
| Collector 20 | InGaAs | Si | $1.0 \times 10^{15}$ ~$2.0 \times 10^{17}$ | 200~500 |
| Base 22 | InGaAs | C | $2.0 \times 10^{19}$ ~$4.0 \times 10^{19}$ | 30~100 |
| Emitter 26 | InP | Si | $1.0 \times 10^{17}$ ~$5.0 \times 10^{18}$ | 50~200 |
| Emitter Contact 28 | InGaAs | Si | $1.0 \times 10^{19}$ ~$2.0 \times 10^{19}$ | 200 |
| Passivation 10 | InP | — | | 20 |

(Second Embodiment)

Figure 3:
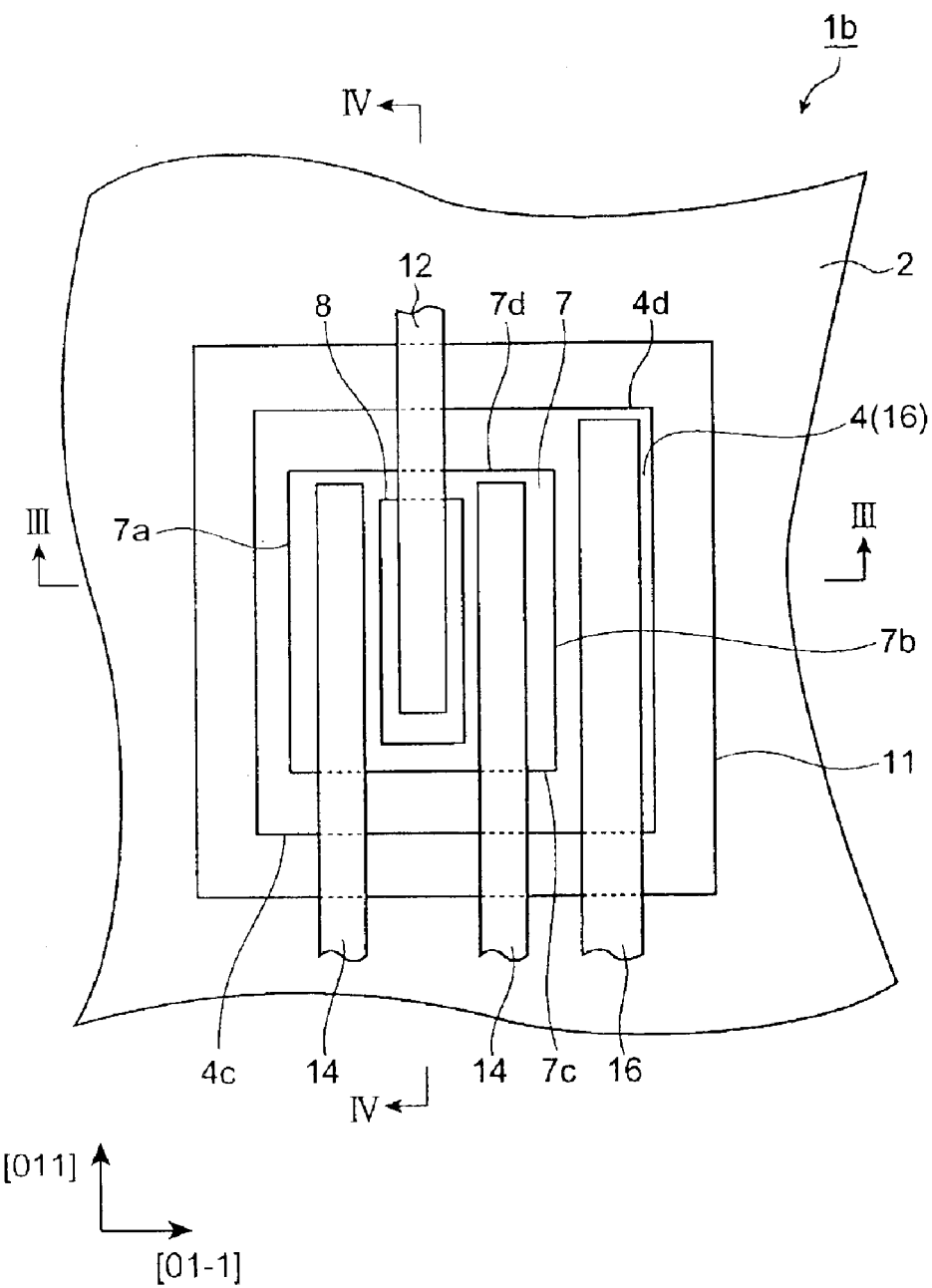
FIG. 3 is a plan view showing the second embodiment of the invention.
Figure 4A:
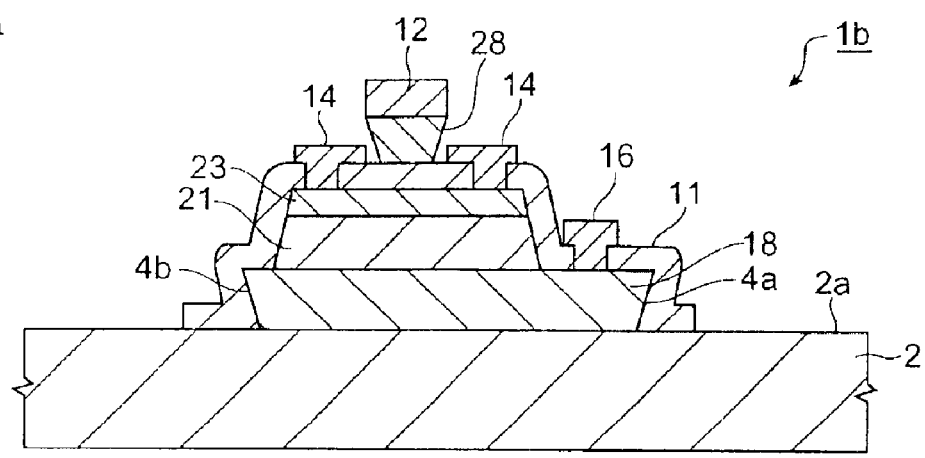
Figure 4B:
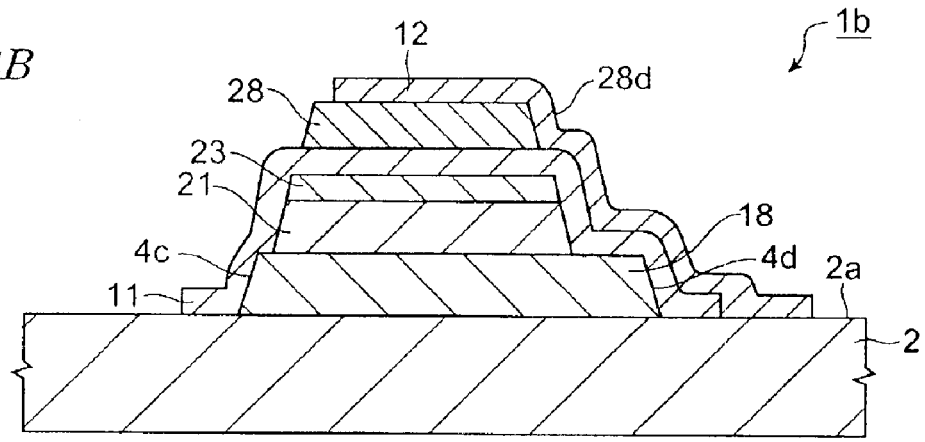
FIG. 4B is a sectional view along the line IV—IV in FIG. 1.

FIG. 3 illustrates an HBT 1b with another configuration. FIG. 4A is a sectional view taken along the line III—III, and FIG. 4B is another sectional view taken along the line IV—IV in FIG. 3. The HBT 1b of the present embodiment is an npn-type transistor and the band gap energy of the emitter is greater than that of the base. FIG. 3 also shows a coordinate system corresponding to the crystal orientation.

As shown in FIG. 3, the HBT 1b has a substrate 2, the first mesa 4, the emitter contact mesa 8 and electrodes of the base 14, the collector 16 and the emitter 12, which are similar to the previously described HBT 1a. However; the HBT 1b has not the passivation layer 10. Further, the HBT 1b has the second mesa 7 instead of the second mesa 6 and the emitter layer 11 instead of the emitter layer 10 in the first embodiment.

The second mesa 7 is disposed on the first region of the first mesa 4 and includes the collector layer 21 and the base layer 23. The second mesa 7 has a pair of side surfaces 7a, 7b extending along the [011] orientation and another pair of side surfaces 7c, 7d extending along the [01–1] orientation. The primary surface of the second mesa 7 has a first region and the second region that surrounds the first region. The base electrode 14 is provided on the second region and extending along the [011] orientation as traversing the side surfaces 7c, 4c of the second mesa 7 and the first mesa 4, respectively. The collector layer 21 is disposed on the sub-collector layer 18, while the base layer 23 is disposed on the collector layer 21.

The emitter layer 11 covers the second mesa 7. Namely, the emitter layer 11 covers the surface of the collector layer 21 and the base layer 23. The emitter layer 11 has two regions. The first region is sandwiched by the base layer 23 and the emitter contact layer 28 whereby provides a function of the wide gap emitter layer, while the second region covers the surface of the base layer 23 and the collector layer 21 whereby provides a function of protection layer. The emitter layer 11 is made of a semiconductor material whose band gap energy is greater than that of the base layer 23 and the collector layer 21. Therefore, the probability that un-desired current leaking pass is formed between the collector and the base can be reduced, whereby the breakdown voltage of the HBT 1b can be increased.

Since the HBT 1b has the emitter layer 11 for covering the base layer 23 and the collector layer 21 instead of an inorganic layer, the same manufacturing process as that for the other semiconductor layer is applicable. This enables that the surface of the semiconductor layer does not expose to the plasma by which the inorganic layer is formed. Therefore, the generation of the surface state and the introduction of the surface damaged due to the plasma process can be prevented.

Further, since a large voltage is applied to the junction between the base and the collector under the normal operating condition of the transistor, a hot electron accelerated by the large applied voltage may be generated at the junction. The edge of the junction is exposed on the side surface of the first mesa 4. When the inorganic layer formed by the plasma process covers the side surface thereof and causes the interface state or the surface state due to the plasma damage, such interface state or the surface state captures the hot electrons. This mechanism increases the leak current flowing close to the surface and the parasitic capacitance. In the present configuration, since the passivation layer made of a semiconductor material covers the exposed junction edge, the capture of the hot electrons can be restrained.

Since the emitter layer 11 serves as the passivation layer, the dopant concentration thereof is preferably between $1.0 \times 10^{16}$ cm$^{-3}$ and $1.0 \times 10^{J}$ cm$^{-3}$. When the dopant concentration of the base layer 23 is about $4.0 \times 10^{19}$ and that of the emitter 11 about $1.0 \times 10^{19}$ cm$^{-3}$, the width of the depletion region formed at the junction becomes about 350 nm, which is enough for the layer 11 to perform the passivation characteristic. The formation of the depletion layer enables to decrease the current flowing within the emitter layer 11. Moreover, since the portion of the emitter layer 11 is completely depleted, the parasitic capacitance can be decreased, thereby preventing the deterioration of the high frequency performance of the HBT 1b.

The emitter layer 11 covers the first mesa 4 that contains the sub-collector layer 18. This reduces the leak current flowing to the next device formed on the substrate 2 because the emitter layer 11 is made of a semiconductor material whose energy gap is greater than that of the sub-collector layer 18.

The emitter contact mesa 8 is disposed on the second mesa 7 and contains the emitter contact layer 28. The emitter electrode 12 is provided on the emitter contact layer 28 and extending along the [011] orientation as traversing the side surface 4d, 7d of the first mesa 4 and the second mesa 7, respectively.

The collector electrode 16 is provided on the second region of the first mesa 4 and extending along the [011] orientation as traversing the side surface 4c of the first mesa 4. It is preferably for securing the electrical contact between the collector electrode 11 and the sub-collector layer 18 to form an opening in the emitter layer 11 on the first mesa. By providing the opening in the emitter layer 11, the electrical contact between the collector electrode 18 and the sub-collector layer is not influenced by a thickness of the emitter layer 11. Further, when a plurality of HBTs are formed on the semiconductor substrate 2, the first mesa 4 electrically isolates the HBTs with each other, where the emitter layer 11 belongs to the respective HBTs.

(Third Embodiment)

Next, a manufacturing process of the HBT will be explained as referring figures from FIG. 5A to FIG. 8B.

Growth of Semiconductor Layers

Figure 5A:
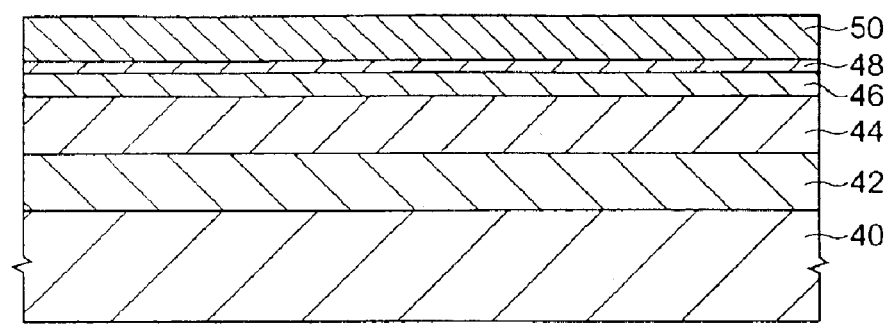
FIG. 5A shows a process for growing semiconductor layers according to the third embodiment of the invention.

In the first epitaxial growth, a series of semiconductor films are grown on a semiconductor substrate 40. As shown in FIG. 5A, a sub-collector film 42, a collector film 44, a base film 46, an emitter film 48 and an emitter contact film are sequentially grown on a semi-insulating InP substrate 40. The growth of films is performed by an Organo-Metallic Vapor Phase Epitaxy (OMVPE) technique. The sub-collector film 42 is doped with an n-type dopant, the concentration of which is greater than that of the collector film 44 so as to decrease the collector dissipation of the bipolar transistor. The collector dissipation is denoted as a product of the current $I_{ce}$ flowing from the collector to the emitter multiplied by the voltage $V_{ce}$ between the collector and the emitter. The sub-collector film 42 is preferably made of InGaAs doped with Si by the upper limit of the dopant concentration of about $5.0 \times 10^{19}$ cm$^{-3}$ and a thickness from 200 nm to 500 nm.

The collector film 44 is also doped with an n-type dopant. It is desirable that the dopant concentration of the collector film is large to improve the collector dissipation. However, an excess concentration causes not only the increase of the base-collector capacitance but also the decrease of the breakdown voltage therebetween. The collector film is preferably made of InGaAs doped with Si by the upper limit of about $1.0 \times 10^{17}$ cm$^{-3}$ and a thickness from 200 nm to 500 nm. Actual thickness of the collector film 44 is determined so that the capacitance between the base and the collector does not increase.

The base film 46 is doped with a p-type dopant. The impurity concentration of the base film 46 is comparatively high in order to reduce the base resistance $r_{bb}$. The thickness of the base film 46 is relatively thin to achieve a high current multiplication of the transistor. Carbon (C) is selected for the p-type dopant because of its high solid solubility as compared with that of zinc (Zn). Moreover, since the diffusion co-efficiency of carbon is smaller than that of zinc, an abrupt profile of the p-type dopant can be obtained within the base film 46. The base film 46 is preferably made of InGaAs with the maximum dopant concentration of about $4.0 \times 10^{19}$ cm$^{-3}$ and a thickness from 30 nm to 100 nm.

The emitter film 48 has a greater band gap energy than that of the base film 46. The emitter film is doped with Si to get an n-type conduction. The emitter film is preferably made of InP with the maximum dopant concentration of $5.0 \times 10^{18}$ cm$^{-3}$ and a thickness from 50 nm to 200 nm.

The emitter contact film 50 has a band gap energy smaller than that of the emitter film 48. The emitter contact film is preferably made of InGaAs doped with Si by the maximum concentration thereof of about $5.0 \times 10^{19}$ cm$^{-3}$ and a thickness is greater than 100 nm. The lower limit of the thickness of the emitter contact film 50 depends on the diffusion length of metals of the emitter electrode by a thermal treatment.

The emitter contact film preferably may have a graded and/or a step-like impurity profile. In these impurity profiles, the impurity concentration at a region apart from the emitter film 48 is greater than the concentration at a region close thereto. Exemplary profile of the graded profile is that the emitter contact film 50 with a thickness of 250 nm is doped with Si from $1.0 \times 10^{18}$ cm$^{-3}$ at the interface to the emitter film 48 to $2.0 \times 10^{19}$ cm$^{-3}$ at the upper surface. Another example of the step-like profile is that the first film is made of InGaAs doped with Si from $1.0 \times 10^{19}$ cm$^{-3}$ to $2.0 \times 10^{19}$ cm$^{-3}$ of a thickness from 100 nm to 200 nm and the second film is made of InGaAs doped with Si from $1.0 \times 10^{18}$ cm$^{-3}$ to $1.0 \times 10^{19}$ cm$^{-3}$ of a thickness from 50 nm to 100 nm.

Emitter Contact Mesa Formation

Figure 5B:
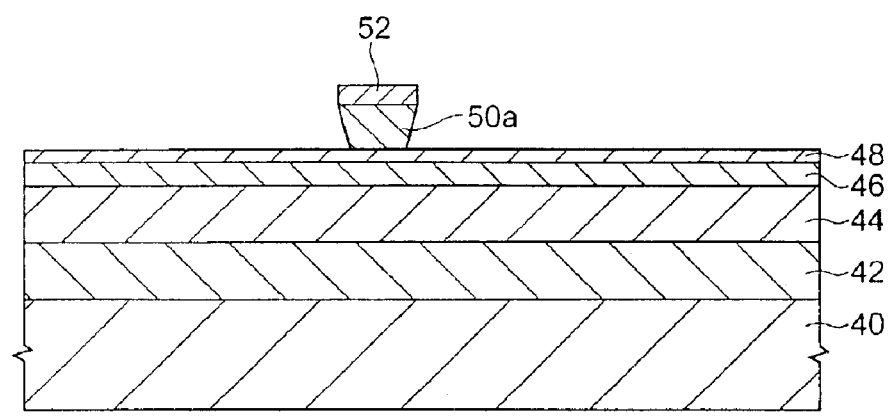
FIG. 5B shows a sectional view of the emitter contact mesa.

As shown in FIG. 5B, a mask layer 52 is formed on the emitter contact film 50. Referring to FIG. 6, the mask 52 has two sides 52a, 52b extending along the [011] orientation and other two sides 52c, 52d extending along the [01–1] orientation. The mask 52 also has additional four sides 52I, 52j, 52k and 52m extending from sides 52c, 52d to form projections 52e to 52h. Namely, one of primary sides 52a to 52d and additional side extending from the next side connecting to the primary side demarcate the respective projections. The emitter contact mesa is etched with a solution containing a phosphoric acid by using the mask 52 as an etching mask. Since this solution etches InGaAs selectively to InP, the InP film of the emitter performs as an etch-stopping film.

FIG. 7 is a plan view illustrating the emitter contact layer 50a after the etching. As shown in FIG. 7, the emitter contact layer 50a with a nearly rectangular shape can be obtained by using the etching mask 52 with protrusions shown in FIG. 6. The emitter contact layer 52 has side surfaces 51a, 51b extending along the [011] orientation and another side surfaces extending along the [01–1] orientation. In the present embodiment, since the solution containing phosphoric acid is used for the mesa formation, the side surfaces 51a, 51b has a reverse taper while the other side surfaces 51c, 51d is a normal taper.

The Second Mesa Formation

Figure 8A:
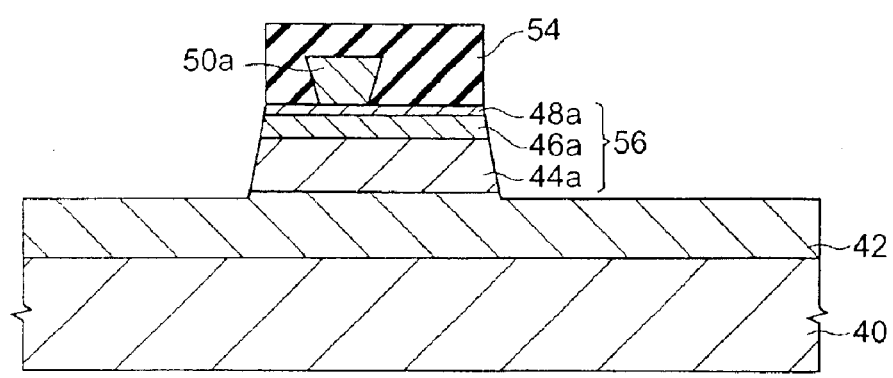
FIG. 8A is a sectional view showing the process of the second mesa formation and FIG. 8b is a sectional view showing the process of the of the first mesa formation.

Referring to FIG. 8A, a mask 54 covers the emitter contact layer 51 and the emitter film 48. The mask 54 demarcates the region where the second mesa is formed. A two-step etching performs the formation of the second mesa. First, the emitter layer 48a is etched selectively to the base film 46. A solution containing hydrochloric acid can be used for the first etching in the case that the emitter film is made of InP while the base film is made of InGaAs. This etchant etches InP selectively to InGaAs. Next, the base film 46 and the collector film 44 are etched to form the base layer 46a and the collector layer 44a. A solution containing sulfuric acid is used as an etchant in the case that both films are made of InGaAs. The etching is performed so as to remove both films completely and to leave a portion of the sub-collector film 42. These two-step etching forms the second mesa 56 that contains the collector layer 44a, the base layer 46a and the emitter layer 48a.

First Mesa Formation

Figure 8B:
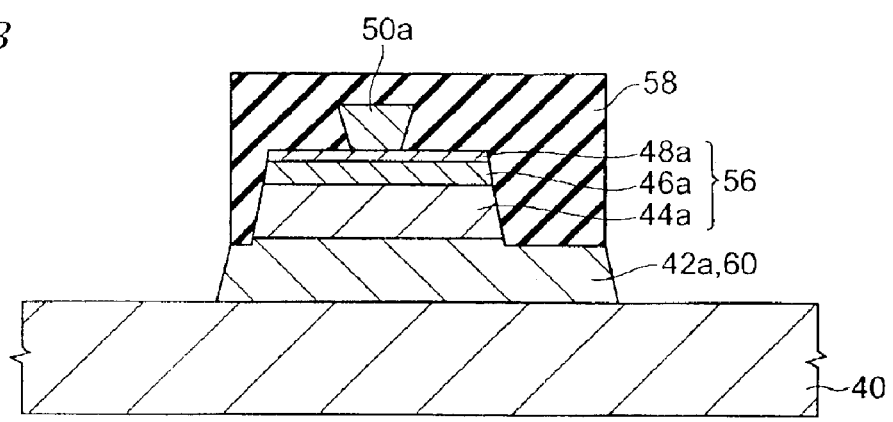

Referring to FIG. 8B, a mask 58 covers the second mesa 56 and the sub-collector film 42. The mask 58 demarcates the region where the first mesa is formed In the case that the sub-collector film is made of InGaAs and the substrate is made of InP, a solution containing phosphoric acid can be used as an etchant. The etching forms the first mesa 60 that includes the sub-collector layer 42a.

Passivation Film Formation

Figure 9A:
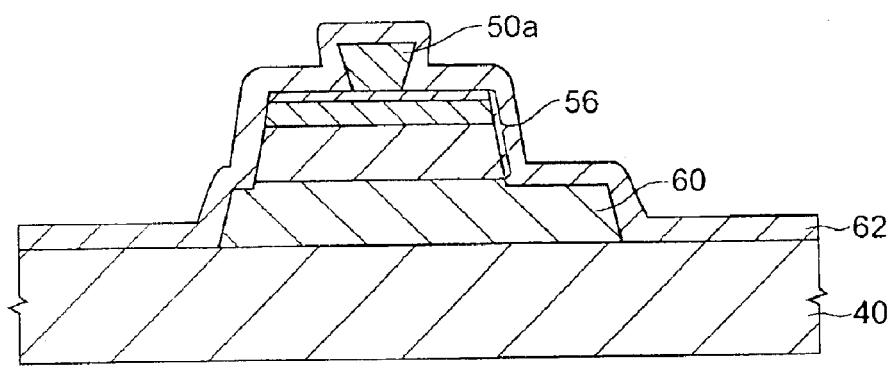
FIG. 9A shows a sectional view of the passivation film growth.

Referring to FIG. 9A, a passivation film 62 covers the substrate 40, the first mesa 60, the second mesa 56 and the emitter contact layer 50a. The passivation film 62 is grown by the OMVPE technique and has a band gap energy greater than that of the sub-collector layer 50a, the collector layer 44a, the base layer 46a, and the emitter contact layer 50a. The impurity concentration of the passivation film 62 is smaller than that of layers covered by the passivation film 62 and decided so as to be depleted when the film 62 contacts to layers covered. The thickness of the passivation film 62 is decided so as to be completely depleted in contacting to layers covered by the film 62.

When InP is used as the passivation film 62, the thickness of the film requires at least about 100 nm, preferably about 200 nm, to cover the mesa structures. The InP passivation film 62 is preferably un-doped, which shows a slightly n-type conduction, with carrier concentration below $1.0 \times 10^{15}$ cm$^{-3}$. The width of the depletion layer is about 200 nm when the film 62 contacts to layers from the sub-collector 42a to the emitter contact 50a. Therefore, if the thickness of the InP passivation film is set to be about 200 nm, the film can be completely depleted. Since no conductive carrier exists in the depletion layer, the leak current flowing between layers from the sub-collector 42a to the emitter contact 48a through the passivation film 62 can be prevented.

Electrode Formation

Figure 9B:
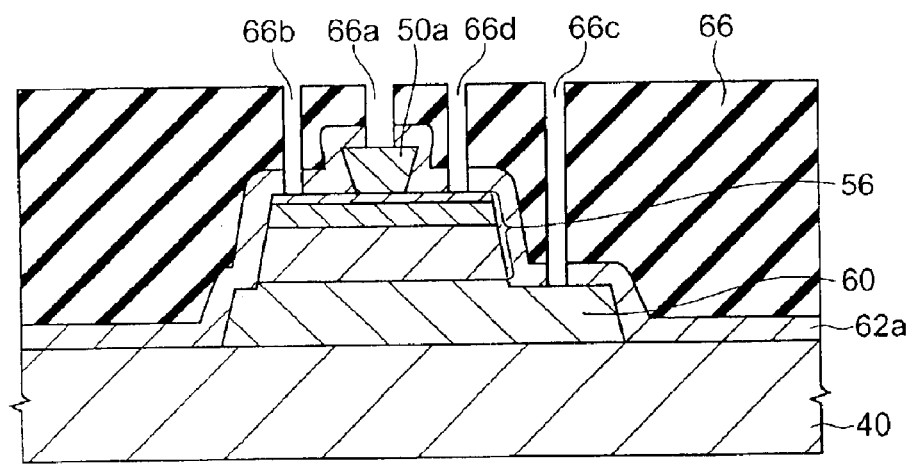
FIG. 9B shows a sectional view after the etching of the passivation film.
Figure 10A:
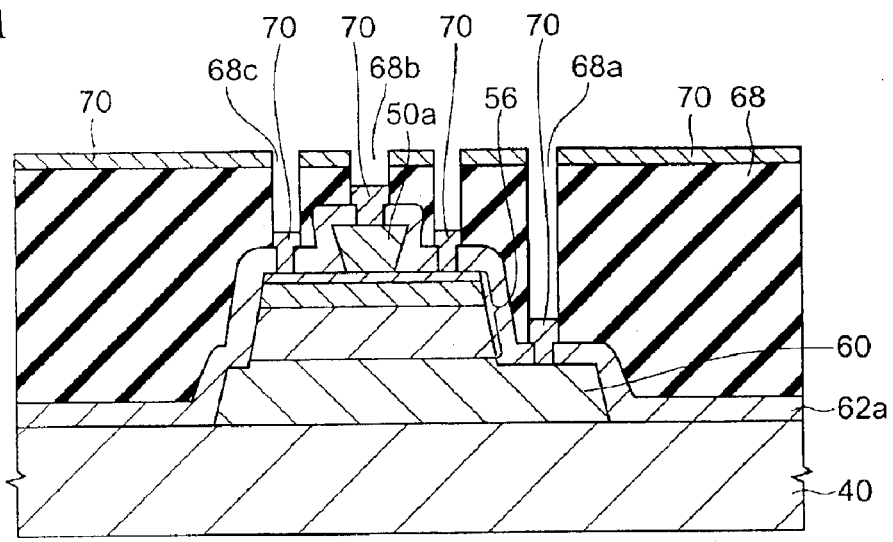
FIG. 10A shows a process for forming the metal electrodes.
Figure 10B:
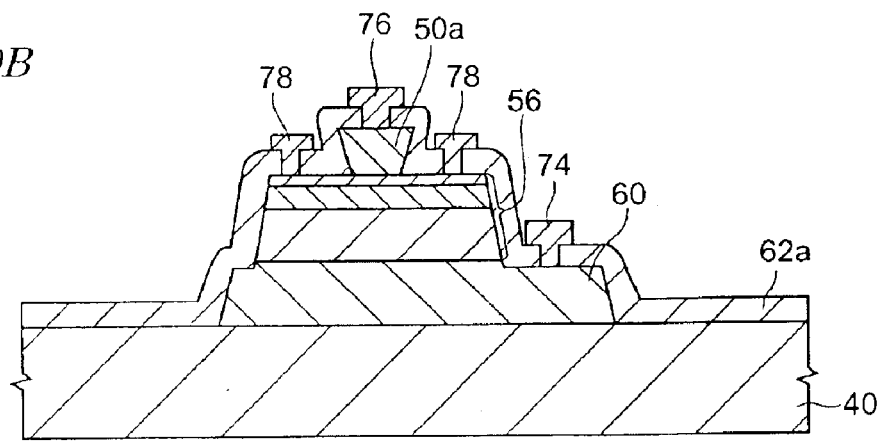
FIG. 10B is a sectional view after completion of the manufacturing process.

Referring to FIG. 9B, a mask 66 covers the passivation film 62. The mask 66 has openings 66a to 66d corresponding to electrodes of the emitter, the collector and the base. By using a solution containing hydrochloric acid, the passivation films 62 are etched to form the openings. A process for forming electrode will be described. After removing the mask 66, by which the openings are formed, another mask 68 is covered on the passivation film 62a. The mask 68 has openings 68a to 68c at regions where the electrodes of the collector, the base and the emitter are formed, and slightly larger than openings previously formed in the passivation film 62. A series of metals made of platinum (Pt), titanium (Ti), platinum (Pt), and gold (Au) are stacked both into the openings and onto the mask. After removing the metals stacked onto the mask 68 by lift-off process, the electrodes of the collector 74, the emitter 76 and the base 78 are obtained, as shown in FIG. 10b. After thermal treatment of the electrodes, the primary process of the HBT is completed. In the explanation, the semiconductor material denoted as InGaAs is In$_{0.53}$Ga$_{0.47}$As whose lattice constant matches to that of InP within ±0.2%. Regailding to the size of the HBT, an exemplary width of the emitter contact mesa is about 1 μm and that of the second mesa is about 2 μm. The length of the respective mesa is preferably from a few micron-meter to a few tenth micron-meter, which depends on the maximum current taken out from the transistor.

(Fourth Embodiment)

Figure 11A:
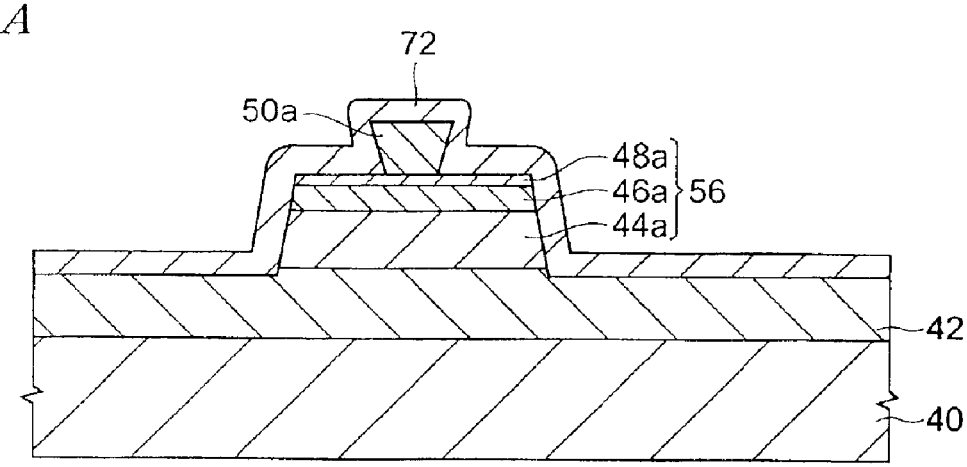
FIG. 11A and FIG. 11B show sectional views for the fourth embodiment of the invention.
Figure 11B:
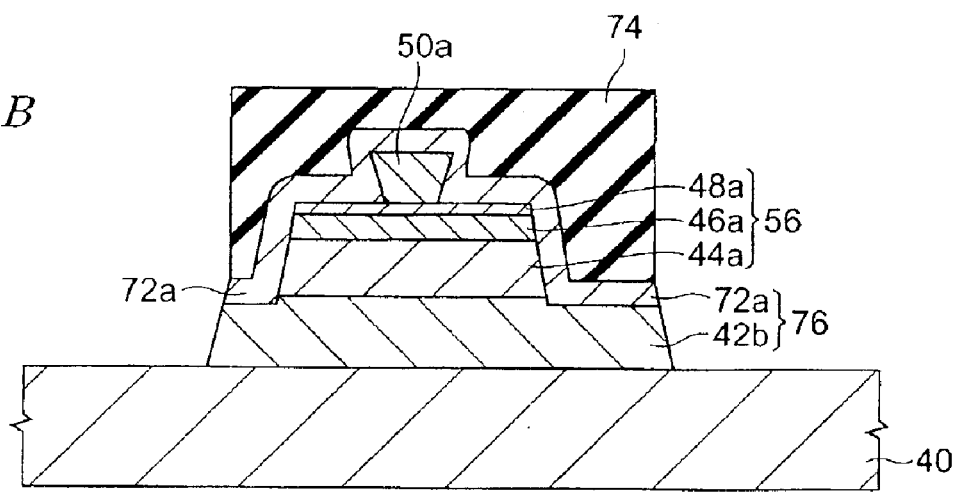

Next, another embodiment will be described as referring to FIG. 11a. In this embodiment, a passivation film 72 is grown subsequently after the formation of the second mesa 56. The growth conditions for the passivation film is same as that for the previously described passivation film 62. However, another conditions may be applied.

The first mesa 76 is formed as follows. After the growth of the passivation film 72, the first mesa 76 is etched by using the two step etching with an etching mask, which demarcates the area of the first mesa 76. First, the InP passivation film 76 is etched by a solution containing hydrochloric acid, next the sub-collector film 42 made of InGaAs is removed by a solution containing phosphoric acid. The first etchant containing hydrochloric acid etches the InP passivation film selectively to the InGaAs sub-collector film and the second etchant containing phosphoric acid selectively etches the InGaAs sub-collector film to the InP substrate.

Figure 12A:
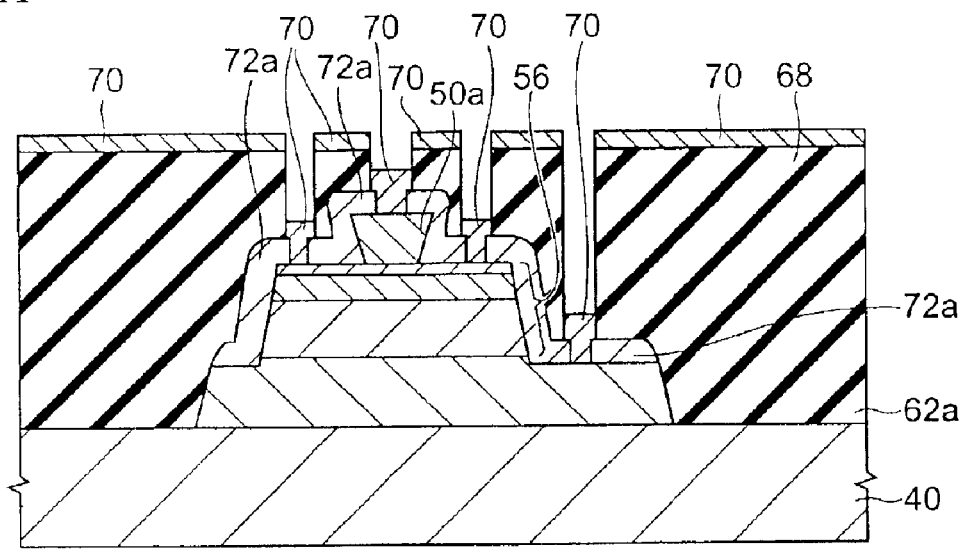
FIG. 12A and FIG. 12B show sectional views at the electrode metal formation process.
Figure 12B:
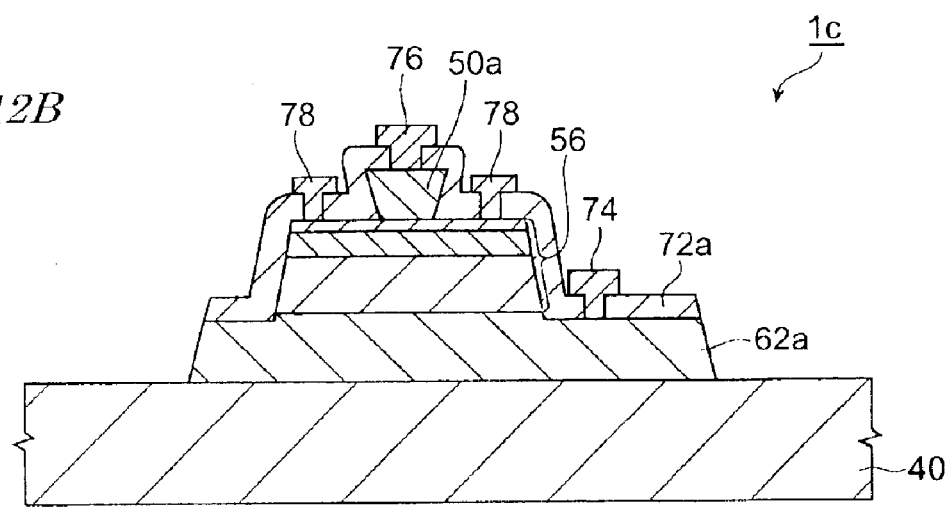

The first mesa 76 formed by the above described process contains the passivation layer 72a and the sub-collector layer 42b. In the case that plural semiconductor devices are integrated in the substrate, the passivation layer 72a belongs to respective devices. Subsequently to the formation of the first mesa 76, electrodes, comprising of the collector, the emitter and the base, are formed by the lift-off process with a photo resist 68 as a lift-off mask, as shown in FIG. 12a. Finally, the HBT 1c according to the fourth embodiment is competed. The HBT 1c has a configuration by which the leak current not only within the HBT 1c but also between the HBTs formed on the substrate can be reduces.

(Fifth Embodiment)

Another manufacturing process of the present invention will be described as referring to drawing from FIGS. 13a to 14c. The HBT according to the fifth embodiment is different from the HBT of the third embodiment in the point that the passivation film serves as the emitter layer.

First Epitaxial Growth

Figure 13A:
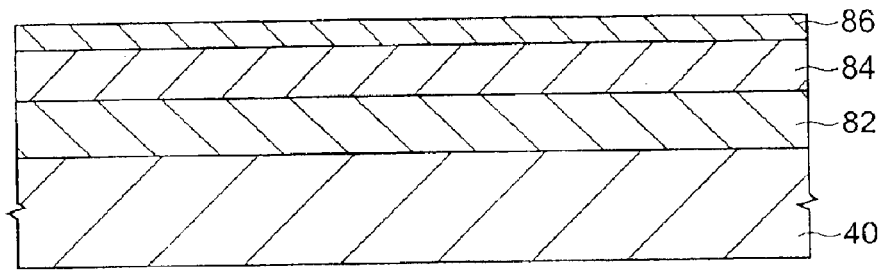
FIG. 13A shows a sectional view after the growth of semiconductor films.
Figure 13B:
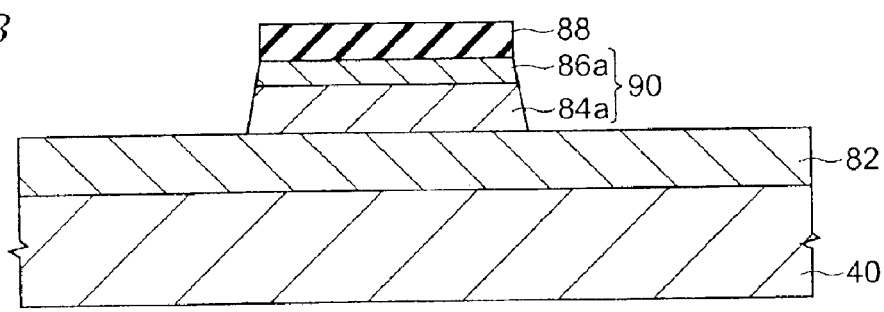
FIG. 13B is a sectional view after the formation of the second.

A series of semiconductor layer are grown on the substrate 40 at the first epitaxial growth. In FIG. 13A, a sub-collector film 82, a collector film 84 and a base film 86 are sequentially grown on the semi-insulating InP substrate. This epitaxial growth is performed by the OMVPE technique. The sub-collector film 82 is made of InGaAs doped with Si, the collector film 84 is un-doped InGaAs and the base film 86 is a carbon doped InGaAs. The doping concentration and the thickness of respective layers are same as the third embodiment.

Second Mesa Formation

After the growth of semiconductor layers, the first mesa 90 is formed. Referring to FIG. 13A, a mask 88 covers the base film 86. The mask 88 demarcates an area where the first mesa is formed. The etching of the base film 86 and the collector film 84 forms the base layer 86a and the collector layer 84a, respectively, and lefts the sub-collector film 82. The etchant may be a solution containing sulfuric acid for layers made of InGaAs. The first mesa 90 contains the base layer 86a and the collector layer 84a.

First Mesa Formation

Figure 13C:
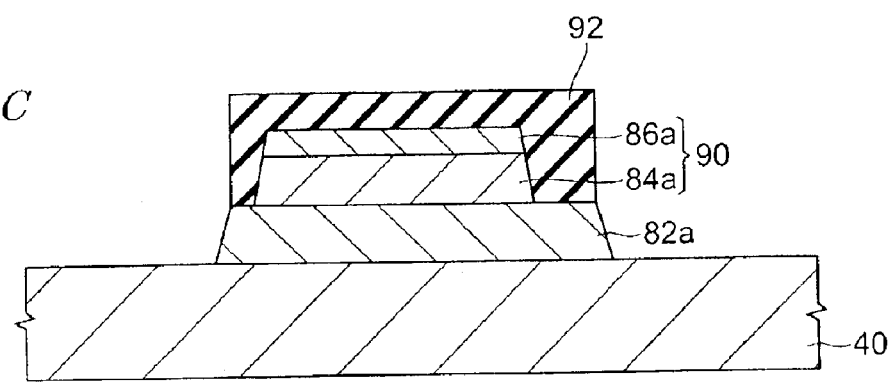
FIG. 13C is a sectional view after the formation of the first mesa.

As shown in FIG. 13C, a mask 92, which demarcates an area where the second mesa is formed, covers the first mesa 90 and the sub-collector film 82. The sub-collector film 82 on the substrate 40 is etched by a solution containing phosphoric acid, in the case that the sub-collector film is InGaAs and the substrate is InP. This etchant containing phosphoric acid selectively etches InGaAs to InP. Thus, the first mesa is formed.

Second Epitaxial Growth

After the first mesa formation, the emitter film 94 and the emitter contact film 96 are sequentially grown on the substrate 40, the first mesa 82a and the second mesa 90. The emitter film 94 covers the second mesa 90 and the first mesa 82a, and the band gap energy of the emitter film 94 is greater than that of the base film 86. Exemplary condition for the emitter film 94 is InP doped with Si. Since the emitter film serves as the passivation film, an impurity concentration of the emitter film 94 is preferably from $1.0 \times 10^{16}$ cm$^{-3}$ to $1.0 \times 10^{17}$ cm$^{-3}$. The band gap energy of the emitter contact film 94 is smaller than that of the emitter film 94. The emitter contact film is preferably made of InGaAs doped with Si by an upper limit from $1.0 \times 10^{19}$ cm$^{-3}$ to $2.0 \times 10^{19}$ cm$^{-3}$ and has a thickness over 200 nm.

Emitter Contact Mesa Formation

Figure 14A:
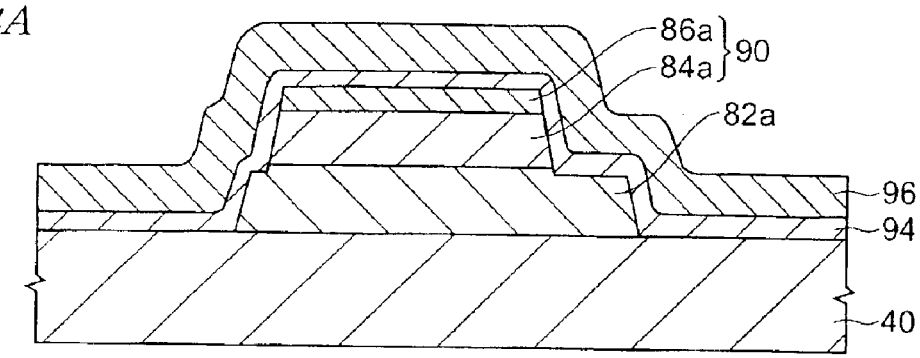
FIG. 14A is a sectional view after the second growth of semiconductor layers.
Figure 14B:
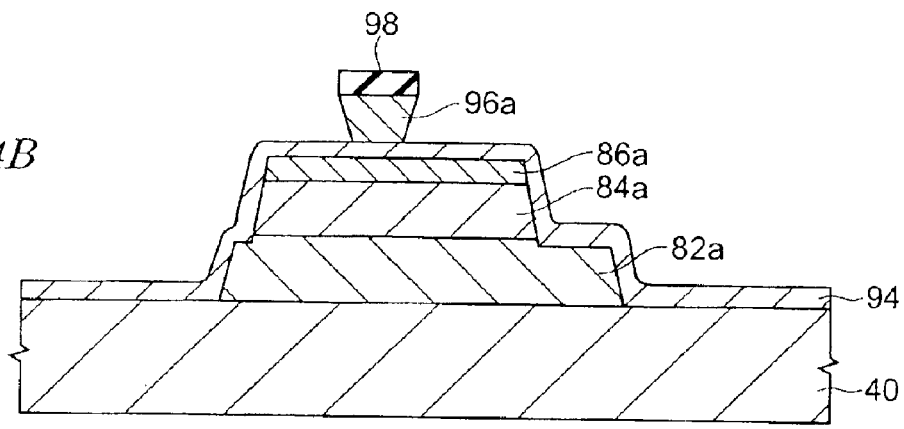
FIG. 14B is a sectional view after the formation of the first mesa.

A process of forming the emitter contact mesa will be described as referring to FIG. 14B. A mask 98 covers the emitter contact film 96. The mask 98 has a plane shape shown in FIG. 6 to form the emitter contact mesa with a substantially rectangular shape. By using a solution containing phosphoric acid as an etchant, the emitter contact mesa 96 is etched. This etchant can etch the emitter contact film 96 selectively to the emitter film 94. Namely, the emitter film 94 performs an etch-stopping layer.

Figure 14C:
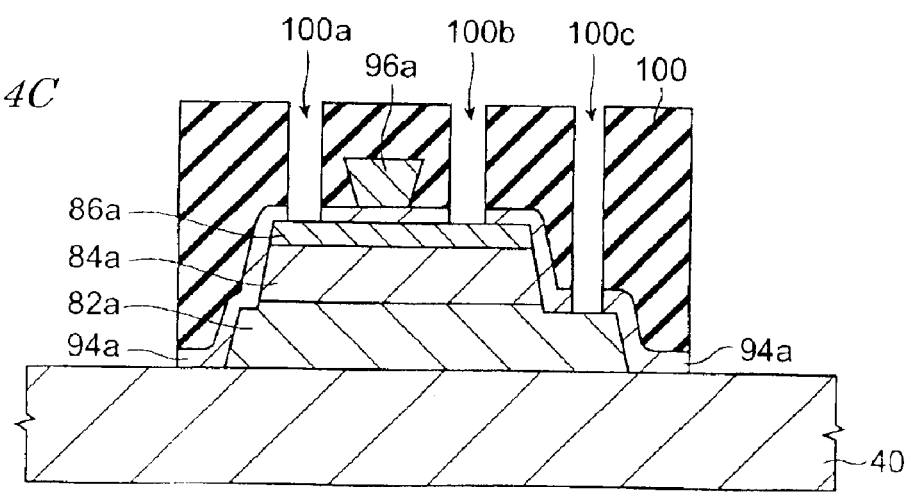
FIG. 14C shows a etching process of the passivation film.

Subsequently to the emitter contact mesa formation, the emitter film 94 is covered by another mask 100. The mask 100 has openings 100a to 100c in regions corresponding to respective electrodes. The mask 100 covers the upper and the side surfaces of the second mesa 90 and the first mesa 82a, as shown in FIG. 14c. The etching of the emitter film 94 forms the emitter layer 94a by a solution containing hydrochloric acid. This etchant can selectively etch the InP film to InGaAs film disposing thereunder. In the case that plural devices are formed on the substrate, the emitter layer 94 belongs to respective devices and is isolated from each other.

Electrode Formation

Figure 15A:
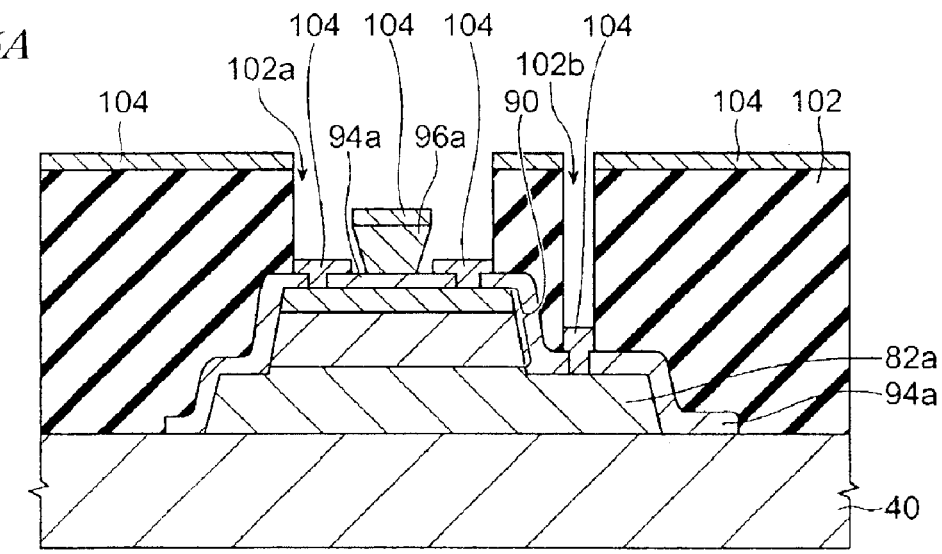
FIG. 15A and FIG. 15B are sectional views showing the formation of the electrode metals.
Figure 15B:
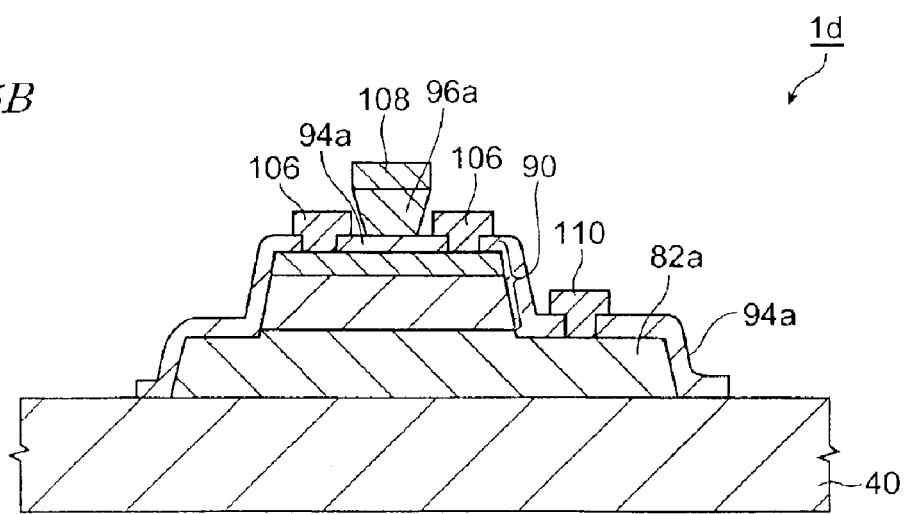

Next, after covering and patterning a resist mask 102, an electrode metal 104 is deposited. The mask 102 has openings 102a, 102b to form the electrodes of the base and the collector are formed. The lift-off process forms the respective electrodes, in which metals on the mask are removed and only metals within the openings are remained. In the present embodiment as shown in FIG. 15B, the base electrode 106 and the emitter electrode 108 are formed by self-alignment process, while the collector electrode 110 is disposed on the sub-collector layer 110. The HBT 1d can be obtained by thus described process.

From embodiments above described, it will be obvious that the invention and its application may be varied in many ways. For example, although semiconductor layers are grown by the OMVPE technique, another method, such as the Molecular Beam Epitaxy (MBE) technique may be applicable for the growth of semiconductor layers. Further, in the drawings, dimensions such as layer thickness will not always reflect their explanation. Indices of surface and axis of the semiconductor crystal appearing in the drawings are exemplary and would contain their equivalent.

What is claimed is:

1. A hetero-junction bipolar transistor, comprising:
   a collector layer having a band gap energy;
   a base layer having a band gap energy;
   an emitter layer having a band gap energy greater than the band gap energy of the base layer, the emitter layer, the base layer, and the collector layer forming a mesa having a side surface; and
   a passivation layer having a band gap energy greater than the band gap energy of the base layer and the band gap energy of the collector layer,
   wherein the passivation layer is made of a semiconductor material and covers the side surface of the mesa formed by the emitter layer, the base layer and the collector layer.

2. A hetero-junction bipolar transistor, comprising:
   a collector layer having a band gap energy;
   a base layer having a band gap energy;
   an emitter layer having a band gap energy greater than the band gap energy of the base layer; and
   a passivation layer having a band gap energy greater than the band gap energy of the base layer and the band gap energy of the collector layer, the passivation layer being made of a semiconductor material and covering the emitter layer, the base layer and the collector layer, the base layer being sandwiched by the emitter layer and the collector layer therebetween.

3. A hetero-junction bipolar transistor according to claim 1, further comprising an emitter contact layer having a band gap energy smaller than the band gap energy of the emitter layer, the emitter contact layer forming a mesa having a side surface, the emitter layer being sandwiched by the emitter contact layer and the base layer therebetween,
   wherein the passivation layer covers the side surface of the mesa formed by the emitter contact layer.

4. A hetero-junction bipolar transistor according to claim 1, further comprising a sub-collector layer, the collector layer being sandwiched by the sub-collector layer and the base layer therebetween, wherein the passivation layer covers at least a surface of the sub-collector layer.

5. A hetero-junction bipolar transistor according to claim 4, further comprising a emitter contact layer having a band gap energy smaller than the band gap energy of the emitter layer, the emitter contact layer forming a mesa having a side surface, the emitter layer being sandwiched by the emitter contact layer and the base layer therebetween, wherein the passivation layer covers the side surface of the mesa formed by the emitter contact layer.

6. A hetero-junction bipolar transistor according to claim 1, wherein the emitter layer is made of InP, the passivation layer is made of un-doped InP, and the collector layer and the base layer are made of InGaAs lattice matched to InP.

7. A hetero-junction bipolar transistor, comprising:

a collector layer having a band gap energy;

a base layer having a band gap energy, the base layer, and the collector forming a mesa having a side surface; and a passivation layer having a band gap energy greater than the band gap energy of the base layer and the band gap energy of the collector layer, the passivation layer being made of a semiconductor material and covering the side surface of the mesa formed by the base layer and the collector layer, wherein the passivation layer serves a function as an emitter layer.

8. A hetero-junction bipolar transistor according to claim 7, further comprising an emitter contact layer having a band gap energy smaller than the band gap energy of the passivation layer, the emitter contact layer forming a mesa having a side surface, wherein the passivation layer is sandwiched by the emitter contact layer and the base layer therebetween.

9. A hereto-junction bipolar transistor according to claim 7, further comprising a sub-collector layer, the collector layer being sandwiched by the sub-collector layer and the base layer therebetween, wherein the passivation layer covers at least a surface of the sub-collector layer.

10. A hetero-junction bipolar transistor according to claim 9, further comprising an emitter contact layer having a band gap energy smaller than the band gap energy of the passivation layer, wherein the passivation layer is sandwiched by the emitter contact layer and the base layer therebetween.

11. A hetero-junction bipolar transistor according to claim 7, wherein the passivation layer is made of un-doped In—P, and the collector layer and the base layer are made of InGaAs lattice matched to InP.

12. A hetero-junction bipolar transistor according to claim 2, further comprising an emitter contact layer having a band gap energy smaller than the band gap energy of the emitter layer, the emitter layer being sandwiched by the emitter contact layer and the base layer therebetween, the passivation layer covering the emitter contact layer, the emitter layer, the base layer and the collector layer.

13. A hetero-junction bipolar transistor according to claim 2, further comprising a sub-collector layer, the collector layer being sandwiched by the sub-collector layer and the base layer therebetween, the passivation layer covering at least a surface of the sub-collector layer.

14. A hetero-junction bipolar transistor according to claim 13, further comprising an emitter contact layer having a band gap energy smaller than the band gap energy of the emitter layer, the emitter layer being sandwiched by the emitter contact layer and the base layer therebetween, the passivation layer covering the emitter contact layer, the emitter layer, the base layer and the collector layer.

15. A hetero-junction bipolar transistor according to claim 2, wherein the emitter layer is made of InP, the passivation layer is made of un-doped InP, and the collector layer and the base layer are made of InGaAs lattice matched to InP.

* * * * *